United States Patent [19]

Novembre

[11] Patent Number: 5,366,851
[45] Date of Patent: Nov. 22, 1994

[54] DEVICE FABRICATION PROCESS

[75] Inventor: Anthony E. Novembre, Union, N.J.

[73] Assignee: AT&T Bell Laboratories, Murray Hill, N.J.

[21] Appl. No.: 122,817

[22] Filed: Sep. 16, 1993

Related U.S. Application Data

[63] Continuation of Ser. No. 734,423, Jul. 23, 1991, abandoned.

[51] Int. Cl.$^5$ .................................................. G03C 5/00
[52] U.S. Cl. .................................. 430/322; 430/326; 430/330
[58] Field of Search ............... 430/270, 322, 325, 326, 430/327, 330

[56] References Cited

U.S. PATENT DOCUMENTS

| | | | |
|---|---|---|---|
| 4,415,653 | 11/1983 | Lai et al. | 430/296 |
| 4,491,628 | 1/1985 | Ito et al. | 430/176 |
| 4,812,542 | 3/1989 | Schwaim et al. | 526/265 |
| 4,996,136 | 2/1991 | Houlihan et al. | 430/313 |

FOREIGN PATENT DOCUMENTS

| | | |
|---|---|---|
| 2001384 | 4/1990 | Canada . |
| 0081633 | 6/1983 | European Pat. Off. . |
| 0211161 | 2/1987 | European Pat. Off. . |
| 0330386 | 8/1989 | European Pat. Off. . |
| 0440374 | 8/1991 | European Pat. Off. . |

OTHER PUBLICATIONS

R. G. Tarascon et al., *Polymer Engineering and Science*, 29, 850 (1989).

L. F. Thompson et al., *Introduction to Microlithography*, ACS Symposium Series 219, American Chemical Society, Washington, D.C., 1983, pp. 186, 199–210.

Tarascon: *Proceedings of Regional Technical Conference on Photopolymers, Principles, Processes and Materials* Mid Hudson Section, Society of Plastics Engineers, Oct. 30, 1988 to Nov. 2, 1988, Ellenville, N.Y. p. 11.

Reichmanis: *Chemistry of Materials*, 1991, 3, pp. 394–407.

Novembre: *Proceedings SPIE*, 1991, 1466, pp. 89–95.

*Primary Examiner*—Marion E. McCamish
*Assistant Examiner*—Kathleen Duda
*Attorney, Agent, or Firm*—Bruce S. Schneider

[57] ABSTRACT

The sensitivity and dry etching pattern control of chemically amplified resists used in the production of devices such as electronic devices is substantially enhanced while image quality is improved through use of a specific expedient. In particular, the resist material after coating on the device substrate, is treated, e.g., heated to sufficiently high temperatures, to remove a portion of the protective groups on the polymeric component of the resist. Generally, when removal up to approximately 90% of the protective groups for substituents such as t-butoxycarboxyl is effected through this procedure, sensitivities as good as 10 mJ/cm$^2$ for an X-ray exposure ($\lambda=14$Å) have been achieved, and both the image quality and dry etching pattern control are improved.

8 Claims, 1 Drawing Sheet

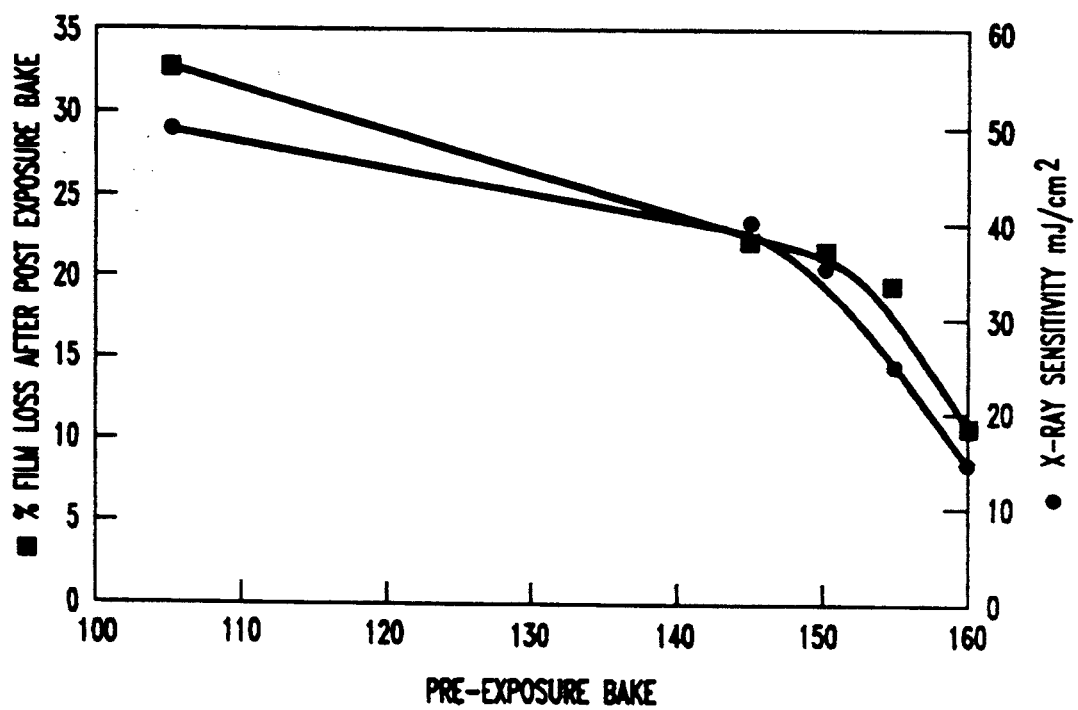

DEVICE FABRICATION PROCESS

This application is a continuation of application Ser. No. 07/734,423, filed on Jul. 23, 1991 now abandoned.

BACKGROUND OF THE INVENTION

1. Field of the Invention

The invention relates to lithographic processes, and in particular, to lithographic processes involving device fabrication.

2. Art Background

Lithographic processes are typically employed in the manufacture of devices such as semiconductor devices. Since the exposure occurs simultaneously over an entire device or a number of devices being processed on a substrate, e.g., a silicon substrate, the procedure is considered a blanket exposure. That is, a material, i.e. a resist, that is sensitive to the exposing light is coated onto a substrate, e.g., a silicon wafter, that is being processed to form a plurality of devices. The coating material is (if desired) baked, subjected to spatially discrete radiation, e.g., light that has been passed through a mask material so that the light reaching the resist corresponds to a desired pattern that is to be transferred into the underlying substrate, and then post-exposure baked before development of the pattern.

Resist materials, including a polymer having a protective group, have been described in U.S. Pat. No. 4,812,542, dated Mar. 14, 1989. The protective group present in these materials is employed in the synthesis process to prevent undesired reactions during formation of the resist material. Such protective groups, since they are not involved in the operation of the resist, are removed before or after exposure throughout the resist material by an expedient such as heating. Thus, for example, in a synthesized polymer, such as poly(4-tert-butoxycarbonyloxystyrene-co-o-nitro-α-methylbenzyl methacrylate), the tert-butoxycarbonyl protective group is removed to leave a hydroxyl substituent. This substituent then performs the function of providing an acid moiety that after exposure and bake provides alkaline solubility to the exposed regions. The protective group, however, is not involved in producing the desired pattern.

Among the lithographic processes that are available to expose resists having protective groups, photolithography is often utilized. Photolithographic processes have the advantage of being suitable for a blanket exposure technique. A blanket exposure is advantageous because it is relatively fast compared to other methods such as the raster scan technique usually employed when the energy used to expose the resist is a beam of electrons. However, generally, resolution obtainable through a blanket exposure with near ultraviolet or visible light is somewhat poorer than that achieved with other methods such as electron lithography.

Improved resolution with a blanket exposure is achievable by using deep ultraviolet or X-ray light. X-ray exposure generally has a potential for better resolution than exposure with deep ultraviolet light, but has not been studied as extensively. One approach to a photoresist sensitive to deep ultraviolet radiation employs a compound that produces an acid moiety upon irradiation together with a polymer that reacts under the influence of heat with the generated acid. This reaction is often through a protective group that is involved in the lithographic process and that is removed from the polymer to form an acidic moiety such as a hydroxyl or carboxylic acid group.

Typical acid generator/acid sensitive polymer combinations include an onium salt as the photosensitive acid generator and a polymer such as poly(4-t-butoxycarbonyloxystyrene) that has a reactive substituent, e.g., a t-butoxycarbonyl protective group. (See Ito, et al. U.S. Pat. No. 4,491,628 dated Jan. 1, 1985.) Such systems are generally referred to as chemical amplification systems since the production of one molecule of acid by actinic radiation induces a reaction in a plurality of molecules in the acid sensitive polymer.

Attempts have been made to improve the sensitivity of chemically amplified resists. Protective groups have been used in materials such as described in Canadian Patent Application 2,001,384. In this patent application, a polymer containing protective groups is solvated and the solution treated by addition of acid with heating to remove a portion of the protective groups. Acid is removed from the resulting partially deprotected polymer, the polymer is then isolated, a photoacid generator is added with a spinning solvent to the polymer, and then this combination is employed to coat the substrate which is subsequently exposed. This procedure is not desirable because it requires an additional reaction after synthesis and a meticulous removal of acid before coating.

To enhance the sensitivity of acid generator/polymer combination, another proposal employs a polymer including both a substituent sensitive to acid and a moiety present in the polymer chain that induces upon irradiation chain scission with associated decrease in molecular weight. As described by R. G. Tarascon, et al., *Proceedings of Regional Technical Conference on Photopolymers, Principles, Processes and Materials*, Mid Hudson Section, Society of Plastic Engineers, Oct. 30 to Nov. 2, 1988, Ellenville, N.Y., page 11 and R. G. Tarascon et al., *Polymer Engineering and Science*, 29, 850(1989), one such combination includes an acid generator and a polymer having a sulfone moiety in the backbone.

Although chemically amplified resists, such as those involving poly(4-t-butoxycarbonyloxystyrene), show great promise for fine line exposure, these materials have demonstrated a tendency to shrink upon exposure and post-exposure baking. Such shrinking produces a loss of image quality and, in part, counteracts resolution improvement available through use of ultraviolet, X-ray, or electron beam exposure. Thus, although chemically amplified resists are extremely promising, some improvement is desirable.

SUMMARY OF THE INVENTION

Chemically amplified resists are improved by a particular processing expedient. In particular, after the resist is formed on the device substrate, a procedure is used to remove a substantial portion of the protecting groups. The amount removed depends on the particular polymer and protecting group. The extent of removal should be sufficient to limit resist volume loss such that the difference in thickness of the resist material in exposed and non-exposed regions just before development is no more than 30%, preferably no more than 25%, most preferably no more than 20%, of the thickness of the resist in non-exposed regions just before development. However, deprotection should not be so great as to prevent development because of a lack of sufficient differential solubility between the exposed and non-exposed regions. For example, in a copolymer of sulfur dioxide and 4-t-butoxycarbonyloxystyrene removal of at least 5%, preferably greater than 15%, most preferably greater than 50%, of the protective groups present in the polymeric constituents of the resist while avoiding removal of more than 90% of these moieties is appropriate. Exposure, post-exposure bake and development leads to a significantly increased sensitivity to the exposing radiation with an improved image quality compared to resist material which has not been partially deprotected. For example, when a resist material comprised of a 2.6:1 4-t-butoxycarbonyloxystyrene: sulfur dioxide copolymer is pre-exposure vacuum hot plate baked at a temperature of 155° C. for 2 min., and post-exposure vacuum hot plate baked at a temperature of 140° C. for 2.5 min., 17.5% of the protective groups in the non-exposed area before development are removed. X-ray sensitivities as good as 25 mJ/cm$^2$ are achieved, and the percent film thickness difference between the area exposed at 25 mJ/cm$^2$ and non-exposed area is 19.3%. In addition, sub 0.5μm patterns can be delineated without loss of image quality due to cracking, distress or other distortions. As a result, the attractiveness of chemically amplified resists for exposure to radiation such as X-radiation, is substantially increased. It also appears that the substantially deprotected pattern remaining after development is more resistant to plasma etching environments than a protected counterpart. It is contemplated that the deprotection reduces the alteration of the plasma chemistry in the etching environment by the amount of volatile or etched products resulting from the film and as compared to the fully protected polymer.

BRIEF DESCRIPTION OF THE DRAWINGS

The FIGURE is illustrative of results achieved in the invention.

DETAILED DESCRIPTION

As discussed, a particular processing sequence for chemically amplified resists leads to a substantial increase in exposure sensitivity in conjunction with improved pattern quality and enhanced feature control upon pattern transfer through etching. The procedure described for processing a resist during the fabrication of a device is conventional except for the treatment employed to remove protective groups after formation of the resist on the device substrate. Thus, for example, conventional exposure and development techniques, such as described in L. F. Thompson et al., *Introduction to Microlithography*, ACS Symposium Series 219, American Chemical Society, Washington, D.C., (1983), pages 199–210, are suitable. Additionally, substrate coating techniques such as spinning, as described in Thompson, supra, page 186, are also advantageously employed. Exposing radiation, such as X-rays, deep ultraviolet radiation, and charge particle beams, such as electron beams, are suitable. The resist material, after exposure and development, is employed for subsequent device processing. For example, the resist overlies a metal layer which is etched to produce a pattern in the metal corresponding to that in the resist. Alternatively, a metal is deposited onto a substrate having a patterned resist and the resist removed to leave behind the deposited metal in the desired pattern. Alternatively, the resist is used as a planarization layer or an ion implantation mask.

The resist materials involved in the invention include a polymer having substituents that are removable with heat and that react with an acid generated by exposure to radiation to remove protective groups and leave aqueous base soluble moieties. (A protective group in the context of this invention is one that contributes to prevention of dissolution of the resist in the developer.) The resist also should have a constituent that generates acid upon exposure to radiation. This constituent is either separate from the polymer material previously described, or forms a portion of this polymeric material. Resists having separate acid generating constituents are described in E. Reichmanis, et al., *Chemistry of Materials*, 3, 394, (1991), while resists having a polymer that contains both an acid generating substituent and an acid sensitive substituent are described in A. E. Novembre et al., *Proceeding SPIE*, 1466, 89 (1991).

After the resist material is formed on the substrate, it is subjected to a procedure that partially removes the protective groups. The more protective groups removed, the greater the enhancement in sensitivity and feature control upon pattern transfer through etching. Additionally sufficient protective groups should be removed such that the difference in thickness between exposed and unexposed regions of the resist just before development is no more than 30% of the thickness of the resist in non-exposed regions just before development. However, the amount of protective groups removed from the polymer should be limited so that there remains an amount sufficient to provide a differential in solubility between the exposed and non-exposed areas to allow pattern development. One advantageous procedure involves heating of the material to a temperature sufficient to cause removal of a suitable portion of the protective group for a time period that yields the desired degree of deprotection. The particular temperature necessary to produce such deprotection depends on the particular polymer and protective group being employed. Generally, for copolymers such as poly(4-t-butoxycarbonyloxystyrene-co-sulfur dioxide) (PTBSS), temperatures in the range 130° to 190° C. are sufficient to cause deprotection. Temperatures less than 130° C. are typically ineffective to produce deprotection, while temperatures above 190° C. generally induce total deprotection in an unacceptably short time period. Often for two component systems the acid generator is sensitive to heating, and temperatures in the range of 125° to 150° C. are more suitable.

The required deprotection need not be performed in one operation. For example, removal of protective groups is possible during both the pre-exposure bake and post-exposure bake steps. Before subjecting the resist to the developing medium, e.g., to the developing solvent, sufficient deprotection in the exposed area should be achieved to allow dissolution of these areas whereas in the non-exposed area deprotection should not be so great to cause significant solubility during development. At least partial deprotection is advantageously performed in a pre-exposure bake because this leads to enhanced sensitivity by requiring fewer groups to be deprotected by acid generation. Subsequently, further deprotection in a post-exposure bake is then desirable because the higher temperatures used for deprotection also improve sensitivity through an increased reaction rate of the acid with the protecting group and further deprotects the unexposed areas resulting in a diminished difference in volume loss (difference in thickness) between exposed and non-exposed regions.

Generally, for polymeric materials such as PTBSS, of varying composition and molecular weight pre-exposure bake in the temperature range from about 130° to 180° C., for time periods in the range 10 sec. to 300 sec., yields corresponding deprotection of from 5 to 70% of the protective groups throughout the resist film. Subsequently, post-exposure baking in the temperature range from about 105° to 150° C., for a time period in the range 10 to 500 sec., yields complete deprotection in the exposed region and up to 90% deprotection in the non-exposed region. A control sample is easily performed to determine the precise temperatures and times needed to attain a desired level of deprotection in a particular resist composition.

As discussed the process employed to induce deprotection should be carefully controlled to avoid removal of so much of the protecting group that there is a resulting loss of pattern delineation upon development because of a corresponding loss of differential solubility. A control sample is easily employed to determine the deprotection level associated with the specific approach to such deprotection.

Typical protective groups employed in the polymer constituent of the resist include t-butoxycarbonyl and t-butyl. These groups are generally used to protect substituents such as hydroxyl or carboxyl. (A t-butoxycarbonyl protective group is generally not suitable for a carboxylate.) These protective groups and protected substituents are advantageously employed with acid generators such as onium salts and nitrobenzyl esters of sulfonic acids. However, the acid generator should be carefully chosen so that it is not substantially affected by the deprotection procedure before exposure. That is, less than 0.5 mole percent of the acid generator present in the resist upon coating should be converted to acid before exposure to the actinic radiation. Thus, if a pre-exposure bake in the temperature range 125° to 150° C. is employed, the acid generator should not undergo substantial decomposition at temperatures below 150° C. For pre-exposure baking in the range 125° to 150° C., acid generators such as bis(2-nitro-6-trifluoromethylbenzyl) 1,3-benzenedisulfonate, described in U.S. Pat. No. 5,135,838, dated Aug. 4, 1992, which is hereby incorporated by reference, are advantageously employed. Other properties desired for the resist constituents are described in U.S. Pat. No. 4,996,136, dated Feb. 26, 1991, which is hereby incorporated by reference.

The following examples are illustrative of the conditions employed to delineate patterns in the inventive technique for producing devices.

EXAMPLE 1

Preparation of resist solution

Approximately 6.15 grams of a 2.6:1 4-tert-butoxycarbonyloxystyrene: sulfur dioxide resist was dissolved in 100 ml of ethyl 3-ethoxypropionate. The solution was filtered twice through a filter stack consisting of 1.0, 0.5 and 0.2 $\mu$m Millipore TEFLON ® filters.

Preparation of resist film

A silicon wafer having its major surface in the 1,0,0 crystallographic plane was treated with hexamethyldisilazane by vapor priming in an oven for 5 min. at 120° C. After this treatment approximately 5 ml of the solution containing the 2.6:1 4-tert-butoxycarbonyloxystyrene: sulfur dioxide resist was placed on the major surface of the wafer and the wafer was spun at 5000 rpm for approximately 1 minute. The coated wafer was then pre-exposed baked on a vacuum hot plate at 155° C. for 2 min. and yielded a resist film thickness of 0.43 $\mu$m.

Image formation

Selected areas of the coated wafer were exposed through a patterned gold on silicon X-ray mask having a 0.4 to 1.0 $\mu$m grouped and isolated line and space features at a series of X-ray ($\lambda = 14$Å) doses ranging from 5 to 40 mJ/cm$^2$ using a Hampshire Instrument Series 5000p proximity print stepper. After exposure of the last area, the wafer was immediately baked at 140° for 2.5 min. using a vacuum hot plate. The film thickness, as measured by a profilometer (Tencor Alpha step), of the exposed and non-exposed areas after baking were taken and the wafer was then immersed for 30 sec. in 0.17N tetramethylammonium hydroxide solution and rinsed for 20 seconds in deionized water. The film thickness of the exposed and non-exposed area were again measured after development.

The measured sensitivity ($D_s$) defined as the minimum dose necessary, to dissolve a 100×150 $\mu$m exposed area in the developer was 25 mJ/cm$^2$. The percent film difference between the area exposed at this dose and the nonexposed area divided by the thickness of the unexposed area after post-exposure bake was 19.3. The measured percent deprotection of the unexposed area resulting from the pre- and post-exposure bake was 17.5.

This value can be compared to a sensitivity of 50 mJ/cm$^2$ obtained for the same resist coated at the same speed (0.475 $\mu$m thick) which had been pre and post-exposure baked at 105° C. for 2 min. and 140° C. for 2.5 min., respectively. The percent film difference in the areas exposed to 50 mJ/cm$^2$ and non-exposed area was 32.6 and no deprotection and film loss in the non-exposed areas prior to development was observed. The FIGURE shows a plot of sensitivity ($D_s$) and percent film thickness difference between the areas exposed at $D_s$ and non-exposed post-exposure baked areas versus the pre-exposure bake temperature.

EXAMPLE 2

All conditions described in Example 1 were used with the exception of the pre-exposure bake condition which was adjusted to 160° C. for 2 min. These conditions resulted in a resist thickness after pre-exposure bake of 0.40 $\mu$m and sensitivity value 15 mJ/cm$^2$. The percent film thickness difference between the film area exposed at this dose and the non-exposed area was 11.0. The percentage of the protective group removed in the non-exposed areas prior to development was 50.

EXAMPLE 3

A 0.42 $\mu$m film of a 2.1:1 4-t-butoxycarbonyloxystyrene: sulfur dioxide resist was formed onto a 5" silicon wafer using a spin speed of 5000 rpm. The coated wafer was vacuum hot plate baked at 150° C. for 2.0 min. The film was subjected to the same exposure energy and conditions as in Example 1 and, after exposure, immediately baked at 140° C. for 1.5 min. and developed as specified in EXAMPLE 1.

The measured sensitivity was 10 mJ/cm$^2$, the percent film thickness differences between the area exposed at this dose and the non-exposed area was 8.3. The percentage of the protective groups removed in the non-exposed areas prior to development was 40. This is compared to the results obtained for a 0.44 $\mu$m film of the above resist after it was pre and post-exposure baked at 105° C. for 2 min. and 140° C. for 2.5 min., respectively. The resulting sensitivity was 30 mJ/cm² and the percent film thickness difference between the area exposed at this dose and the non-exposed area was 25.4. No deprotection and film loss of the non-exposed area resulting from the baking conditions was observed.

EXAMPLE 4

Into approximately 200 ml of ethyl 3-ethoxypropionate was added approximately 40 gms of a 3:1 4-t-butoxycarbonyloxystyrene: sulfur dioxide copolymer and approximately 3.2 gms of bis(2-nitro-6-trifluoromethylbenzyl) 1,3benzenedisulfonate (the polymer was prepared as described in U.S. Pat. No. 4,996,136 dated Feb. 26, 1991, and the acid-generator was prepared as described in U.S. patent application Ser. No. 07/565074 dated Aug. 9, 1990.) The solution was then filtered three times through a stack of TEFLON ® polymer membrane filters with the top-most filter having an average pore size of 1.0 μm, the middle filter having an average pore size of 0.5 μm and the lower-most filter having an average pore size of 0.5 μm and the lower-most filter having an average pore size of 0.2 μm.

A silicon wafer having its major surface in the 1,0,0 crystallographic plane was treated with hexamethyldisilazane by vapor priming in a Yield Engineering Systems, Inc. oven at approximately 120° C. for approximately 3 minutes. After this treatment approximately 5 ml of the solution of resist polymer and acid generator was placed on the major surface of the wafer and the wafer was spun at 5,000 rpm for approximately 1 minute. The wafer was then pre-exposure baked at 130° C. for 120 seconds on a vacuum hot plate and yielded a resist film thickness of 0.95 μm. (The coating and pre-exposure baking was done on a Silicon Valley Group System 88 Wafer Track.) The wafer was then inserted into a sample holder of a GCA LaserStep ® prototype Deep UV Exposure System having an 0.35NA lens and 5X reduction optics. Exposure (λ=248 nm) was done through a patterned chrome on quartz mask having lines and spaces varying from 0.25 up to 10 μm. The exposure dose was delivered in dose units where each dose unit is approximately equal to 0.8 mJ/cm², and the dose was delivered in the range of 2-98 dose units. The wafer was removed from the exposure tool and immediately baked at 115° C. for approximately 30 seconds on a Semiconductor Systems, Inc. vacuum hot plate baking station. The thickness of the non-exposed areas of the resist film after post-exposure bake was approximately 0.85 μm. The percent film thickness difference between the exposed and non-exposed regions after post-exposure bake was approximately 24.

The wafer was then developed by immersion into a solution of 1:15:1.6 tetramethylammonium hydroxide: water: 2-propanol. The dose required to form 0.5 μm line and space images was approximately 34 dose units.

This result compares to the results obtained when the pre-exposure bake was done at 105° C. for 1.0 minute. Using this condition 96 dose units were required to resolve the 0.5 82 m line and space images and the percent difference in thickness between the area exposed at 96 dose units and the non-exposed regions of the film after post-exposure bake was 32.

I claim:

1. A process for producing a device comprising the steps of depositing a radiation sensitive material on a substrate baking said material, exposing said material to patterned actinic radiation, baking said material after said exposure, subjecting said material to a developer to delineate a pattern, and employing said material with said pattern in fabricating said device characterized in that said radiation sensitive material comprises a material having a substituent including a protective group and that after said baking after exposure but before said subjecting said material to developer a sufficient amount of said protective groups are removed from said material such that the difference in thickness between exposed and non-exposed regions is less than 30 percent of the thickness of said material in non-exposed regions.

2. The process of claim 1 wherein said bake before exposure is done at a temperature in the range 130° to 180° C.

3. The process of claim 2 wherein said bake after exposure is done at a temperature in the range 105° to 150° C.

4. The process of claim 1 wherein said bake after exposure is done at a temperature in the range 105° to 150° C.

5. The process of claim 1 wherein said protective group comprises t-butoxycarbonyl.

6. The process of claim 5 wherein said material comprises poly (4-t-butoxycarbonyloxystyrene-co-sulfur dioxide).

7. The process of claim 1 wherein said material comprises poly (4-t-butoxycarbonyloxystyrene-co-sulfur dioxide).

8. The process of claim 1 wherein said radiation sensitive material includes a composition separate from said material that generates an acid upon said exposure to said radiation.

* * * * *